(12) United States Patent
Cheng

(10) Patent No.: US 7,245,494 B2
(45) Date of Patent: Jul. 17, 2007

(54) THERMAL STRUCTURE FOR ELECTRIC DEVICES

(75) Inventor: Chih-Hung Cheng, Wugu Township, Taipei County (TW)

(73) Assignee: CPUMate Inc., Taipei (TW)

(*) Notice: Subject to any disclaimer, the term of this patent is extended or adjusted under 35 U.S.C. 154(b) by 1 day.

(21) Appl. No.: 11/285,028

(22) Filed: Nov. 23, 2005

(65) Prior Publication Data

US 2006/0291166 A1 Dec. 28, 2006

(30) Foreign Application Priority Data

Jun. 24, 2005 (TW) .............................. 94210692 U

(51) Int. Cl.
*H05K 7/20* (2006.01)
(52) U.S. Cl. ................ 361/700; 165/104.33; 165/80.4; 165/104.26; 257/715; 174/15.2; 361/695
(58) Field of Classification Search ................ 361/699, 361/697, 695, 700, 399; 174/15.1, 15.2, 174/16.1, 16.3; 257/714, 715; 165/80.4, 165/104.26, 104.23
See application file for complete search history.

(56) References Cited

U.S. PATENT DOCUMENTS

| | | | | |
|---|---|---|---|---|
| 6,830,098 B1* | 12/2004 | Todd et al. | ............. | 165/104.33 |
| 7,028,758 B2* | 4/2006 | Sheng et al. | ............ | 165/104.21 |
| 2006/0144572 A1* | 7/2006 | Yu et al. | ................ | 165/104.33 |

* cited by examiner

Primary Examiner—Javaid H. Nasri

(57) ABSTRACT

A thermal module includes a thermal body, at least one thermal tube, and a holding part. The thermal tube includes a heat receiving portion and condenser terminals connecting with the thermal body, wherein the heat receiving portion has a plane. The holding part includes a plate body with trenches therein, wherein the trenches has through holes and a connecting part formed between the through holes. The through holes are used for receiving and holding the heat receiving portion of the thermal tube. The connecting part are connected with a top surface of the heat receiving portion. Thus, thermal transfer is speed up, and the thermal module is assembled without a thermal treatment which causing a copper reduction reaction, resulting in improvement of thermal conduction, reduction of cost, and manufacturing time saving.

8 Claims, 7 Drawing Sheets

THERMAL STRUCTURE FOR ELECTRIC DEVICES

BACKGROUND OF THE INVENTION

1. Field of the Invention

The present invention relates to a thermal module, and particularly relates to a thermal module used for increasing the speed of thermal transfer, reducing the manufacturing time, and reducing cost of product.

2. Description of Related Art

With the rapid development of the technology industry, the size of the electric devices, such as CPU and a memory, are getting smaller, and the heat generated during the computer is operated is getting more and more. In order to take the huge and dense heat away from the computer to external environment and keep the electric devices under the allowable temperature for operation, usually, a heat sink with a large area of base is installed on the electric devices, or the speed of the fan is increased. As a result, other problems, such as noise, overweight, cost, and the complexity of the computer system, are generated. Thus, a good way to solve thermal problems is definitely required.

Currently, heat pipes with an excellent thermal conductivity, a light weight, a simple structure, and multiple functions can transfer a lot of heat without power consuming. Thus, it is widely used in electric devices for heat dissipating. How to assemble of the heat pipes and the heat sink? It is a significant subject for sloving.

A conventional thermal module mainly comprises a thermal body, heat pipes, and a thermal base. The thermal body is made by stacking a plurality of fins. Holes are formed through the fins. One of the terminals of the heat pipe is connected with the fins through the holes. A plurality of parallel trenches for receiving the other terminal of the heat pipe are formed in the thermal base. In the steps of assembling, first, a metal with a low melt point is paste on the bottom of the trenches. Next, a thermal treatment is performed after passing the heat pipes through the trenches. Thus, during the thermal treatment, the heat pipes are joined with the trenches for formed a thermal module.

However, the manufacturing cost is increased, due to the conventional step of pasting the metal with a low melt point. Furthermore, an oxidization occurs on the surfaces of the heat pipes and the thermal base, such that a copper reduction is necessary to be performed. In this manner, it is difficult to reduce the manufacturing time and steps.

SUMMARY OF THE INVENTION

The present invention is to provide a thermal module comprising a thermal body, at least one thermal tube, and a holding part. The thermal tube for heat dissipating directly is connected with a top surface of electric devices. The thermal tube is hold and fixed with the fixing plate. Therefore, the thermal module is assembled without a thermal treatment which causing a copper reduction reaction.

DETAILED DESCRIPTION OF THE PREFERRED EMBODIMENT

The following provides exemplary embodiments of the present invention with reference to the accompanying drawings.

Figure 1:
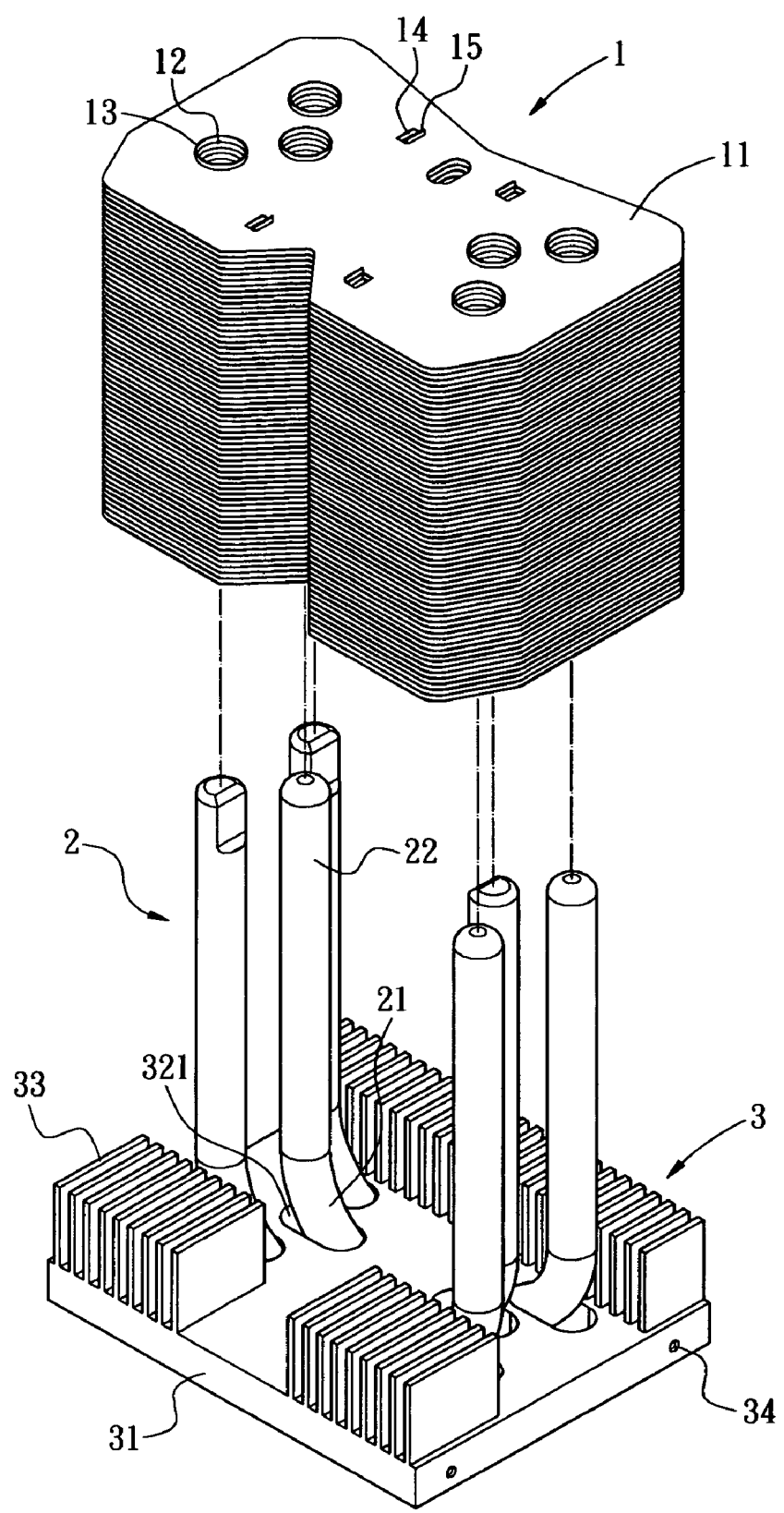
FIG. 1 is a perspective exploded view showing an embodiment of the present invention.
Figure 2:
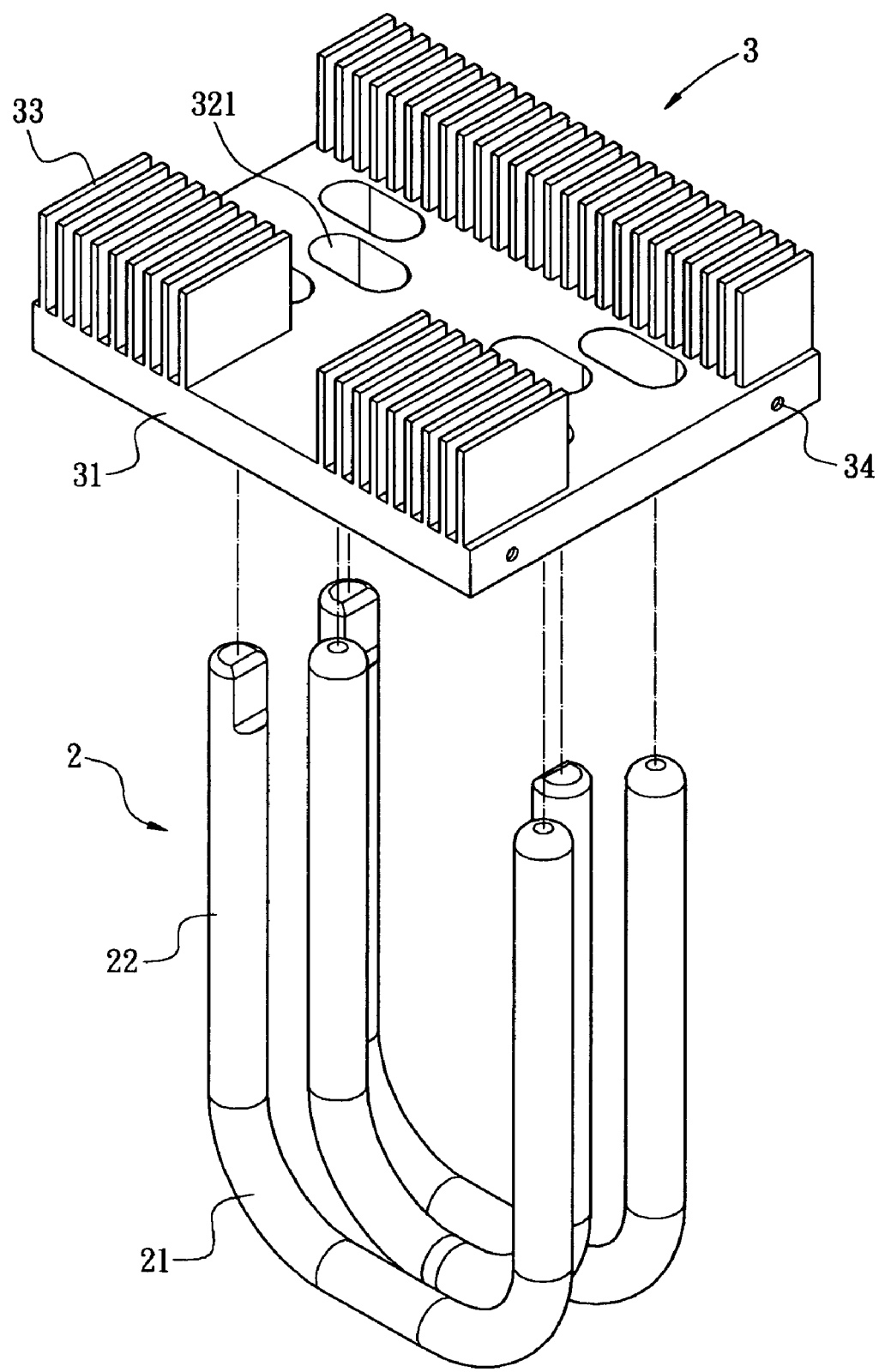
FIG. 2 is a partial perspective exploded view showing a thermal tube and a holding part according to an embodiment of the present invention according to another view.
Figure 3:
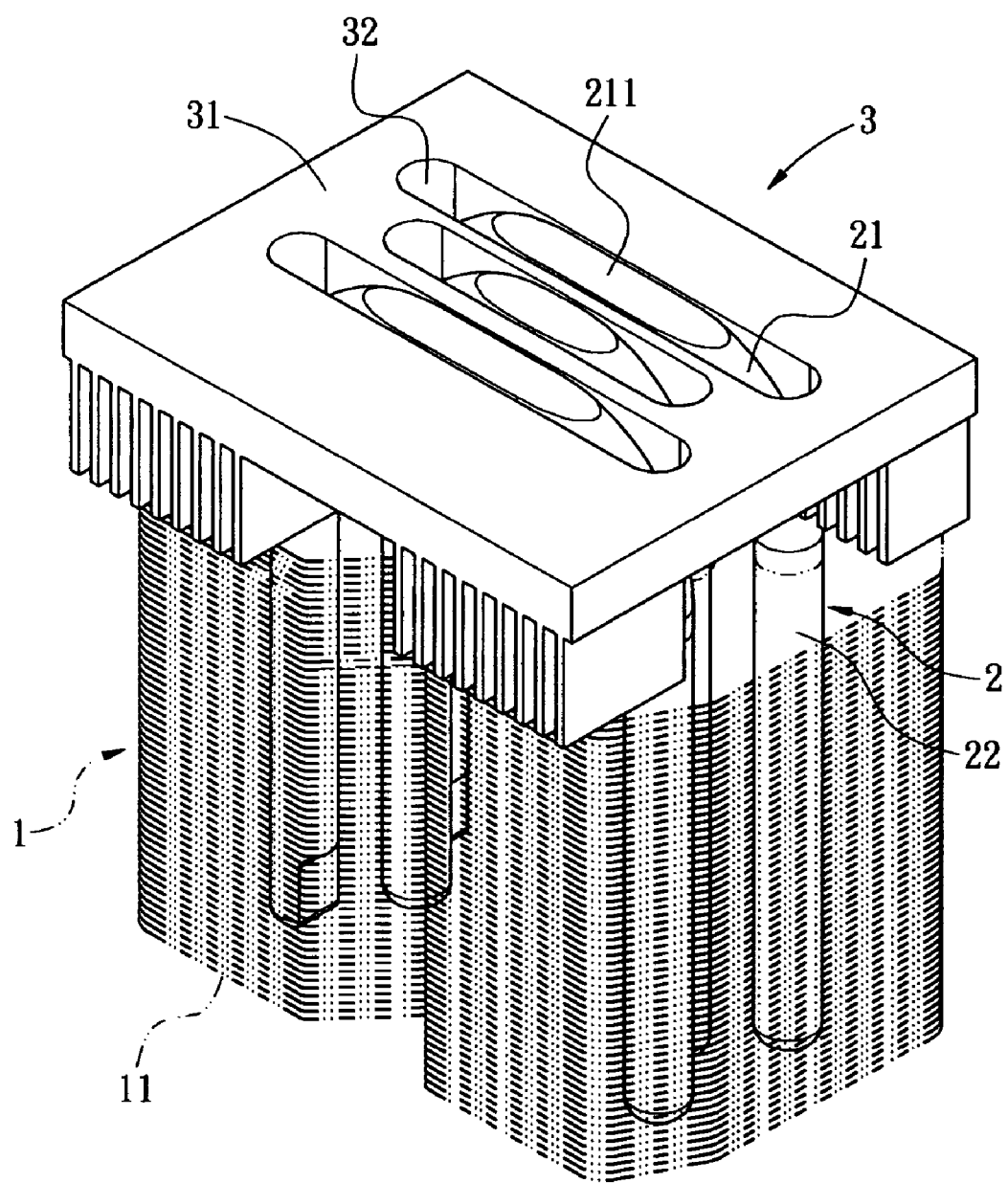
FIG. 3 is an angle of view showing an embodiment of the present invention.

In FIGS. 1 trough 3, a thermal module comprising a thermal body 1, at least one thermal tube 2, and a holding part 3 is provided.

The thermal body 1 is made of stacking fins 11, which comprises aluminum, copper, or other metal with excellent thermal conductivity. A plurality of holes 12 are formed through each of the fins 11. Ring walls 13 are formed surrounding the top of the holes 12. A plurality of rectangle holes 14 are formed in the middle of each of the fins 11. A retaining wall 15 bending upward is formed on one side of each of the rectangle holes 14. The height of the retaining wall 15 is the same with that of the ring wall 13, such that the distance serving as a thermal fluid between each two of the fins 11 is always the same after assembling of the fins 11. In another embodiment, the thermal body 1 is made by extruding (not shown).

The thermal tube 2 comprising capillarity or a working fluid has an L or U shape, but not limited to. In this embodiment, U shaped is preferred as shown in the figures. The thermal tube 2 comprises a heat receiving portion 21 located at the bottom and two condenser terminals 22 located at the two arms. The bottom of the heat receiving portion 21 is a plane 211 for connecting with electric devices generating heat. The condenser terminals 22 pass through the holes 12 of the fins 11.

The holding part 3 having a plate body 31 is made of aluminum or other materials with light weight. A plurality of trenches 32 are formed in the plate body 31. Each trench comprises two through holes 321 at its two ends and a connecting part 322 between the two through holes 321 located at one trench 32. The heat receiving portion 21 of the thermal tube 2 is embedded in the trench 32 and passes through the through holes 321. The connecting part 322 is leaned against the top of the heat receiving portion 21 of the thermal tube 2. The through holes 321 are periphery-closed and used for compactly receiving and holding the heat receiving portion 21 of the thermal tube 2. Fins are formed on the both sides of the top of the plate body 31. Screwing holes 34 are formed on the both sidewalls of the plate body 31.

During assembling, the condenser terminals 22 are passing through the through holes of the trenches 32, so as to level the plane 211 of the heat receiving portion 21 and the base of the holding part 3 at the same. Then, the fins 11 are assembled as a whole by stacking to form the thermal body 1. Finally, the condenser terminals 22 of the thermal tube 2 is passing through and joined with the corresponding holes 12 of each of the fins 11. As a result, no thermal treatment is necessary. According to the present invention, a copper reduction reaction causing by the conventional thermal treatment would not occur on the thermal tube. Therefore, manufacturing time and product cost are greatly reduced.

Figure 4:
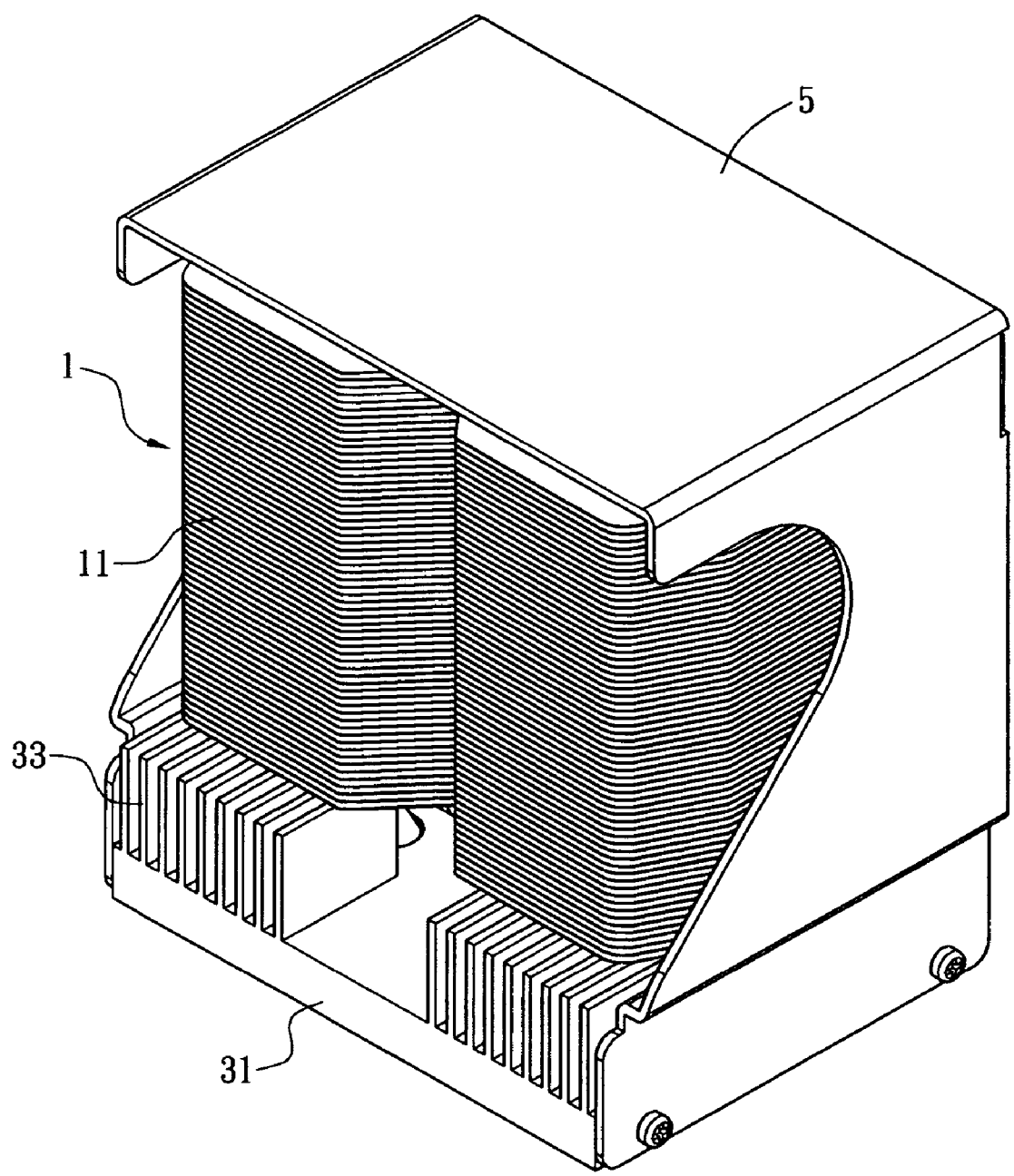
FIG. 4 is an assembled view showing a thermal module with a fan cover according to an embodiment of the present invention with a video graphic card.

In FIG. 4, according another embodiment of the present invention, the thermal module further comprises a fan cover 4. The fan cover 4 with a U shaped is used for cover on the both sides of the thermal body 1 and fixed on the screwing holes 34 of the holding part 3 via fixing components, such as a screw.

Figure 5:
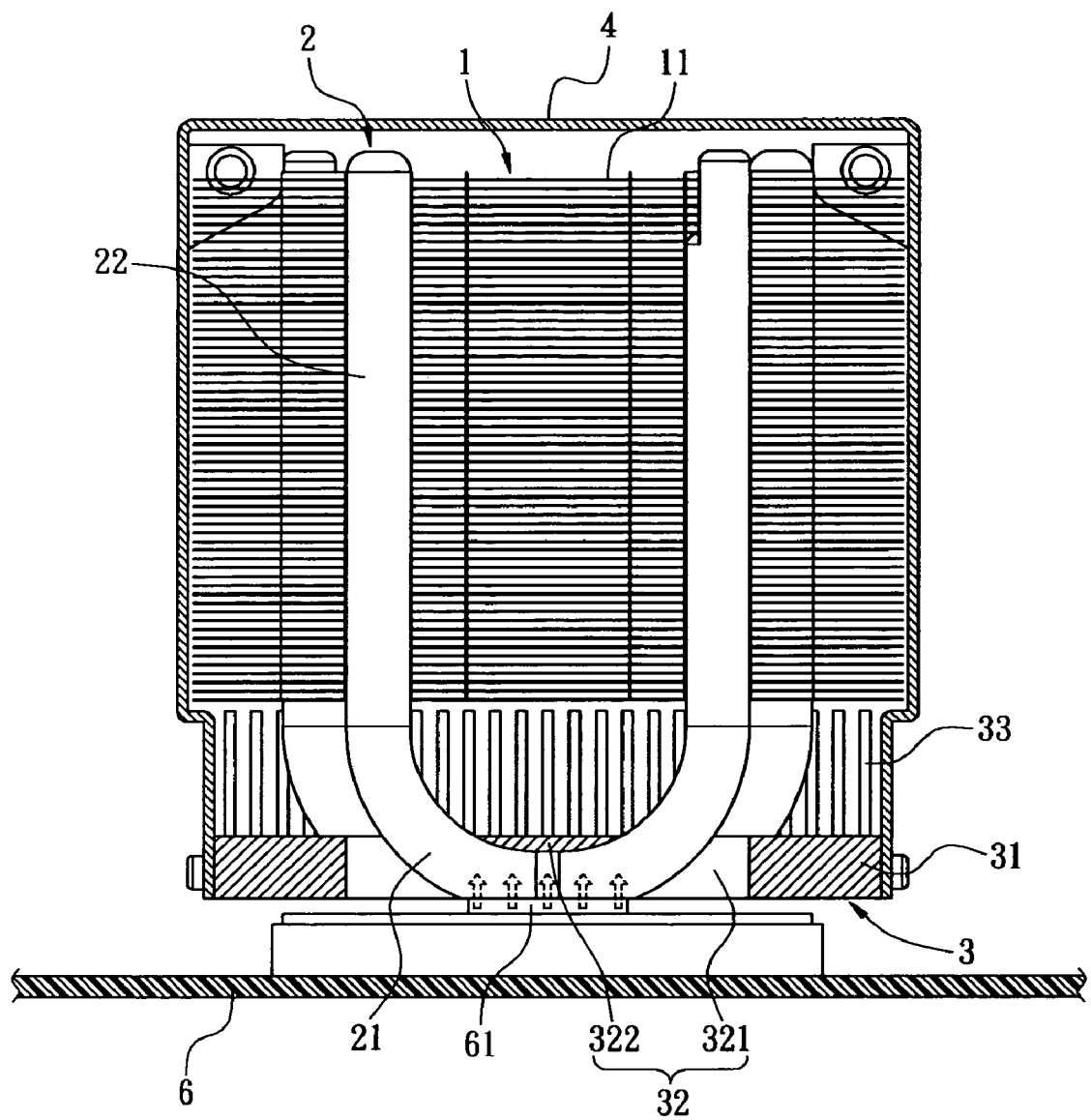
FIG. 5 a schematic drawing illustrating the proceeding of operation of a CPU according to an embodiment of the present invention with a video graphic card.
Figure 6:
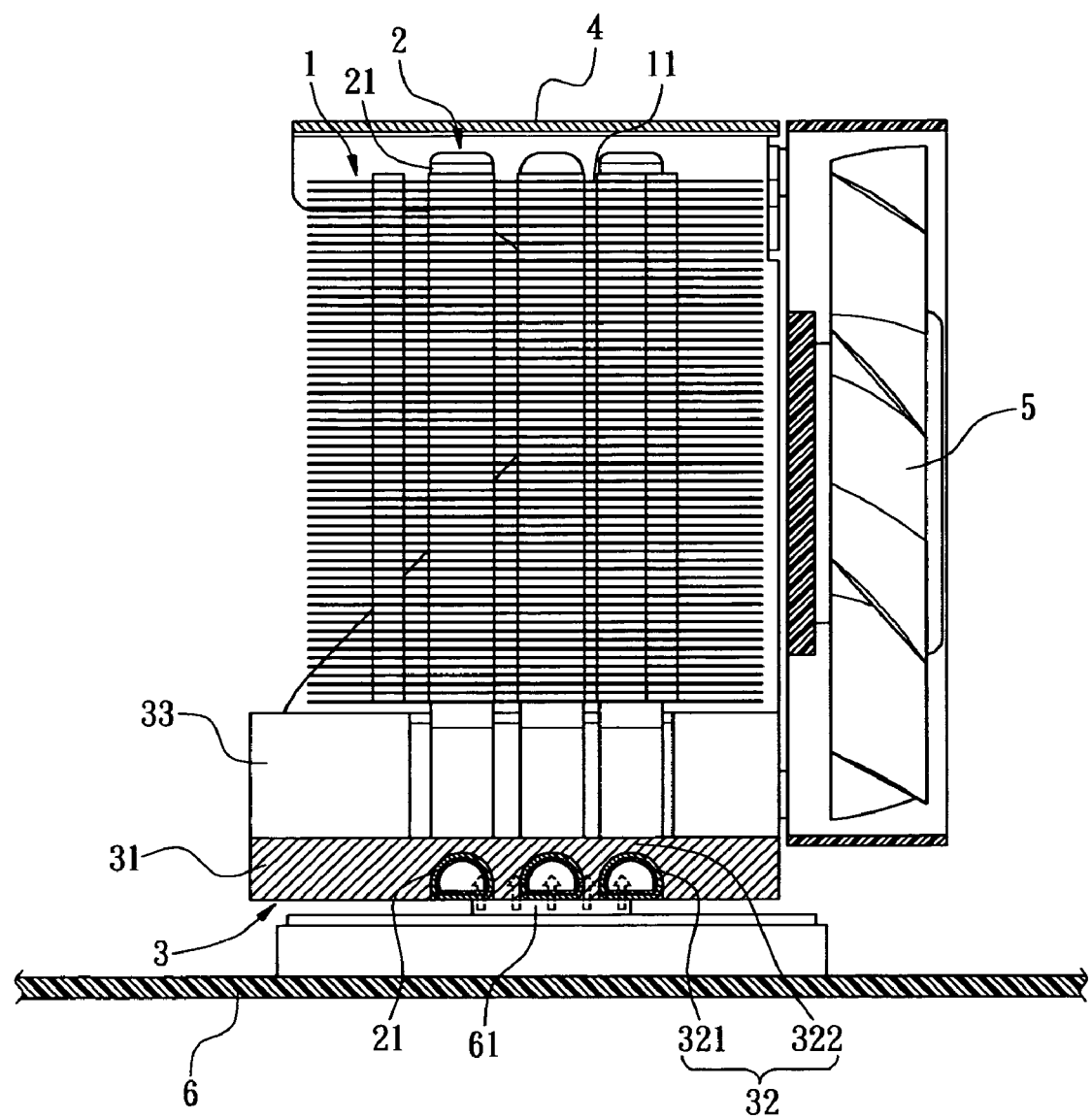
FIG. 6 is another angle of view illustrating the proceeding of operation of a CPU according to an embodiment of the present invention with a video graphic card.

In FIGS. 5 and 6, according also another embodiment of the present invention, the thermal module is joined with a fan 5. The thermal module is applied in a motherboard 6 of a computer comprising a central processing unit (CPU) 61. The holding part 3 is installed on the CPU 61. A plane 211 of the heat receiving portion 21 covers on the top surface of the CPU 61, such that heat generated by the CPU 61 during high speed operation can be taken away by the thermal tube 2. The heat is, then, eliminated by the fins 11 of high thermal conductivity. The CPU 61 is allowed to be operated under a certain temperature without a crashed or burnout problem causing by over heat.

Figure 7:
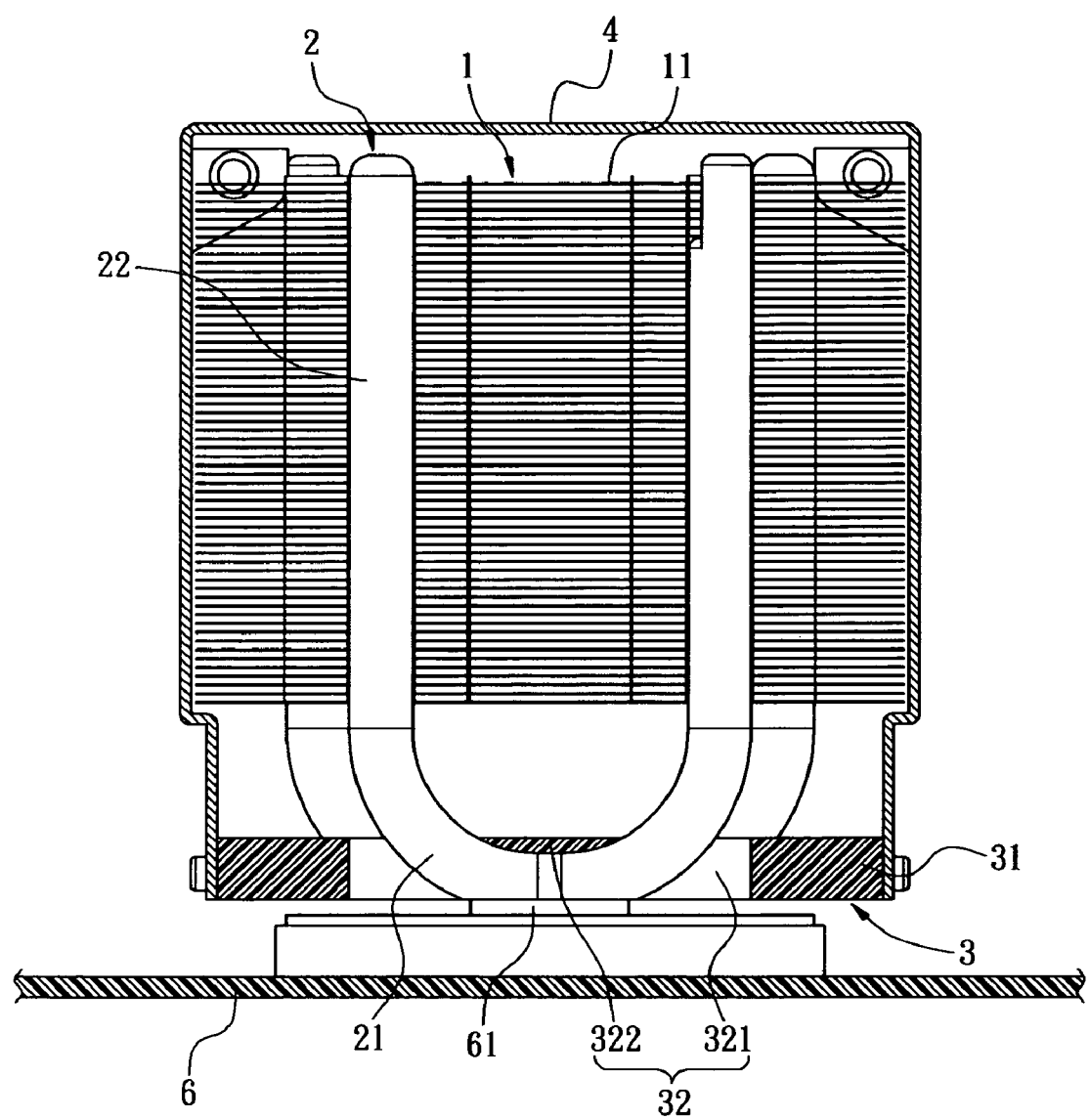
FIG. 7 is a cross-section view of another embodiment of the present invention.

In FIG. 7, according further another embodiment of the present invention, the holding part 3 is made of plastics by extruding, so as to reduce the total weight of the thermal module and save the cost of the materials.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A thermal module, comprising:
   a thermal body;
   at least one U-shaped thermal tube, comprising a heat receiving portion located at a bottom of the thermal tube and two condenser terminals located at two arms of the thermal tube, wherein the condenser terminals connect with the thermal body, wherein the heat receiving portion comprises a plane; and
   a holding part, comprising a plate body with at least one trench therein, wherein the trench comprises two periphery-closed through holes and a connecting part formed between the through holes, the heat receiving portion of the thermal tube is embedded in the trench and passes through the through holes, and the connecting part is leaned against a top surface of the heat receiving portion.

2. The thermal module as claimed in claim 1, wherein the thermal body is composed of a plurality of fins stacked together.

3. The thermal module as claimed in claim 2, wherein the fins are made of aluminum, copper, or the combination thereof.

4. The thermal module as claimed in claim 1, wherein the holding part is made of plastics.

5. The thermal module as claimed in claim 1, wherein the holding part is made of aluminum.

6. The thermal module as claimed in claim 5, further comprising a plurality of fins extending from the plate body of the holding part.

7. The thermal module as claimed in claim 1, wherein the thermal tube is compactly received and held by the trenches of the holding part.

8. The thermal module as claimed in claim 1, further comprising a fan cover covered on the both sides of the thermal body and fixed on the holding part.

* * * * *

(12) EX PARTE REEXAMINATION CERTIFICATE (10106th)
United States Patent
Cheng

(10) Number: US 7,245,494 C1
(45) Certificate Issued: Apr. 9, 2014

(54) THERMAL STRUCTURE FOR ELECTRIC DEVICES

(75) Inventor: Chih-Hung Cheng, Wugu Township, Taipei County (TW)

(73) Assignees: CPUMate Inc., Wugu Township, Taipei County (TW); Golden Sun News Techniques Co., Ltd., Wugu Township, Taipei County (TW)

Reexamination Request:
No. 90/020,052, Mar. 22, 2013

Reexamination Certificate for:
Patent No.: 7,245,494
Issued: Jul. 17, 2007
Appl. No.: 11/285,028
Filed: Nov. 23, 2005

(30) Foreign Application Priority Data

Jun. 24, 2005 (TW) .................................. 94210692 U

(51) Int. Cl.
*H05K 7/20* (2006.01)

(52) U.S. Cl.
USPC ............. 361/700; 165/104.33; 165/80.4; 165/104.26; 257/715; 174/15.2; 361/695

(58) Field of Classification Search
None
See application file for complete search history.

(56) References Cited

To view the complete listing of prior art documents cited during the proceeding for Reexamination Control Number 90/020,052, please refer to the USPTO's public Patent Application Information Retrieval (PAIR) system under the Display References tab.

*Primary Examiner* — Angela M Lie

(57) ABSTRACT

A thermal module includes a thermal body, at least one thermal tube, and a holding part. The thermal tube includes a heat receiving portion and condenser terminals connecting with the thermal body, wherein the heat receiving portion has a plane. The holding part includes a plate body with trenches therein, wherein the trenches has through holes and a connecting part formed between the through holes. The through holes are used for receiving and holding the heat receiving portion of the thermal tube. The connecting part are connected with a top surface of the heat receiving portion. Thus, thermal transfer is speed up, and the thermal module is assembled without a thermal treatment which causing a copper reduction reaction, resulting in improvement of thermal conduction, reduction of cost, and manufacturing time saving.

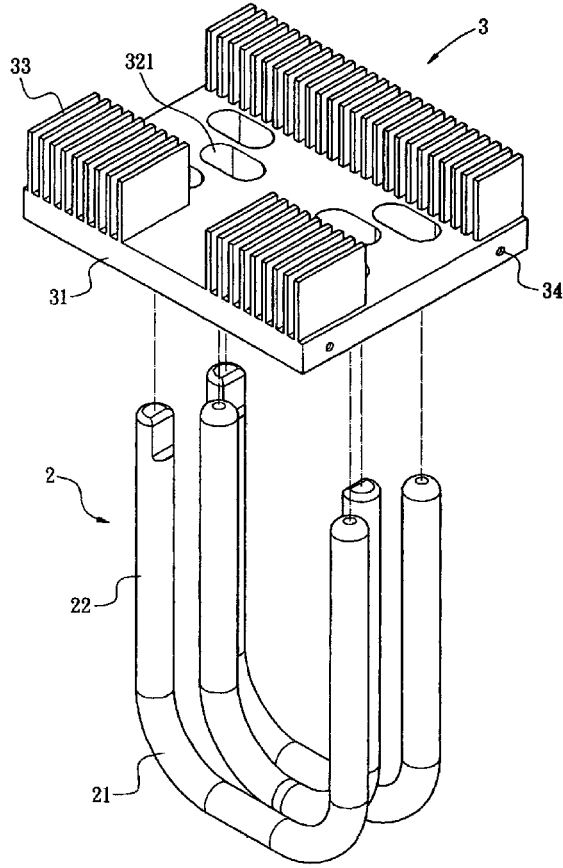

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1-2 are determined to be patentable as amended.

Claims 3-8, dependent on an amended claim, are determined to be patentable.

1. A thermal module, comprising:
    a thermal body;
    at least one U-shaped thermal tube, comprising a heat receiving portion [located at a bottom of the thermal tube] and two condenser terminals [located at two arms of the thermal tube, wherein the condenser terminals connect with the thermal body] *extending from two ends of the heat receiving portion, respectively*, wherein the heat receiving portion comprises a plane *surface*; and
    a holding part, comprising a plate body with *a first surface and a second surface opposite to the first surface*, at least one trench [therein] *being formed on the first surface*, wherein the trench comprises two periphery-closed through holes *formed on the second surface* and a connecting part formed between the *two* through holes, the heat receiving portion of the thermal tube is embedded in the trench and *the two condenser terminals* [passes] *pass* through the through holes, *respectively, to have the plane surface coplanar with the first surface*, and a [first] *third* surface of the connecting part is leaned against a [top] surface of the heat receiving portion *opposite to the plane surface* and a [second] *fourth* surface of the connecting part opposite to the [first] *third* surface is coplanar with the [plate body] *second surface*.

2. The thermal module as claimed in claim 1, wherein the thermal body is composed of a plurality of fins stacked together, *a plurality of holes for the condenser terminals respectively passing through are formed through each fin, a ring wall is formed surrounding the top of each hole, a plurality of rectangle holes are formed in each fin, a retaining wall bending upward is formed on one side of each rectangle hole, and a height of the retaining wall is the same with that of the ring wall, such that a distance serving as a thermal fluid between two adjacent fins is always the same after assembling of the fins*.

\* \* \* \* \*